(12) United States Patent
Basehore et al.

(10) Patent No.: US 12,353,266 B2
(45) Date of Patent: Jul. 8, 2025

(54) ADAPTIVE FREQUENCY CONTROL IN INTEGRATED CIRCUITS

(71) Applicant: Google LLC, Mountain View, CA (US)

(72) Inventors: Derek James Basehore, Mountain View, CA (US); Nick Sanders, Saratoga, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 18/006,828

(22) PCT Filed: Jul. 27, 2020

(86) PCT No.: PCT/US2020/043749
§ 371 (c)(1),
(2) Date: Jan. 25, 2023

(87) PCT Pub. No.: WO2022/025861
PCT Pub. Date: Feb. 3, 2022

(65) Prior Publication Data
US 2023/0280816 A1    Sep. 7, 2023

(51) Int. Cl.
*G06F 1/324*    (2019.01)
*H03K 5/135*    (2006.01)

(52) U.S. Cl.
CPC ............ *G06F 1/324* (2013.01); *H03K 5/135* (2013.01)

(58) Field of Classification Search
CPC .. G06F 1/324; G06F 1/04; G06F 1/08; H03K 5/135; H03K 5/00006; H03K 5/13; Y02D 10/00
See application file for complete search history.

(56) References Cited

U.S. PATENT DOCUMENTS

| | | |
|---|---|---|
| 9,685,965 B2 | 6/2017 | Hashimoto |
| 10,033,362 B1 | 7/2018 | Shan et al. |
| 2004/0098631 A1* | 5/2004 | Terrell, II ............... G06F 1/324 713/322 |
| 2007/0043964 A1* | 2/2007 | Lim ........................ G06F 1/324 713/322 |

(Continued)

FOREIGN PATENT DOCUMENTS

WO    2022025861    2/2022

OTHER PUBLICATIONS

"International Search Report and Written Opinion", Application No. PCT/US2020/043749, Apr. 13, 2021, 13 pages.

(Continued)

*Primary Examiner* — Paul Yen
(74) *Attorney, Agent, or Firm* — Colby Nipper PLLC (57) ABSTRACT

This document describes systems and techniques for adaptive frequency control in integrated circuits. In response to operating conditions that permit a lower frequency of a clock signal, the described systems and techniques dynamically reduce the clock frequency without adjusting the frequency of an input clock signal. The clock frequency is decreased by gating a fraction of the input clock signal and stretching the ungated cycles by an offset amount. By dynamically adjusting the clock frequency in this manner, an integrated circuit can change its clock frequency more quickly and maintain the supply voltage closer to a lower voltage limit to reduce power consumption and allow safer operations.

20 Claims, 7 Drawing Sheets

(56) References Cited

U.S. PATENT DOCUMENTS

| | | | |
|---|---|---|---|
| 2008/0091974 A1* | 4/2008 | Nakashima | G06F 9/5044 |
| | | | 714/10 |
| 2010/0277246 A1* | 11/2010 | Seth | H03L 1/027 |
| | | | 331/34 |
| 2010/0301912 A1* | 12/2010 | Kim | H03L 7/0816 |
| | | | 327/158 |
| 2011/0194575 A1* | 8/2011 | Chen | G06F 1/06 |
| | | | 327/276 |
| 2012/0297232 A1 | 11/2012 | Bircher | |
| 2018/0018009 A1 | 1/2018 | Kommrusch et al. | |
| 2018/0348809 A1 | 12/2018 | Saint-Laurent et al. | |

OTHER PUBLICATIONS

"International Preliminary Report on Patentability", Application No. PCT/US2020/043749, Jan. 31, 2023, 10 pages.

"Foreign Office Action", EP Application No. 20757998.8, Apr. 14, 2025, 9 pages.

* cited by examiner

ADAPTIVE FREQUENCY CONTROL IN INTEGRATED CIRCUITS

RELATED APPLICATION(S)

This application is a national stage entry of International Application No. PCT/US2020/043749, filed Jul. 27, 2020, the disclosure of which is incorporated herein by reference in its entirety.

Background

This document describes systems and techniques for adaptive frequency control in integrated circuits. More particularly, but not exclusively, this document describes a method for adaptively controlling a frequency of an output clock signal.

A clock frequency and a supply voltage define operation points of integrated circuits (e.g., central processing units (CPUs)). A given supply voltage allows the integrated circuit to operate at a given frequency of a clock signal. Because power consumption is proportional to the square of the voltage, minimizing the supply voltage to reduce power consumption is an essential aspect of engineering an integrated circuit.

One technique to save power is adaptive voltage scaling, which attempts to minimize the supply voltage for a given clock frequency. Because using the supply voltage that satisfies the timing requirements for a given clock frequency under all operating conditions wastes power, the integrated circuit monitors different operating conditions (e.g., process, voltage, temperature) to scale the voltage. A significant voltage margin is generally required to ensure that timing requirements of the integrated circuit are satisfied for the highest possible voltage drift and to avoid potential brownout. The response time to change the clock frequency, however, can take hundreds of microseconds. A quicker response time to ensure that voltage drifts do not violate timing requirements can allow an integrated circuit to run closer to its lower voltage limit, resulting in reduced power consumption and safer operations.

SUMMARY

This document describes systems and techniques for adaptive frequency control in integrated circuits. In response to operating conditions that permit a lower frequency of a clock signal, the described systems and techniques dynamically reduce the clock frequency without adjusting the frequency of an input clock signal. The clock frequency is decreased by gating a fraction of the input clock signal and stretching the ungated cycles by an offset amount. By dynamically adjusting the clock frequency in this manner, an integrated circuit can change its clock frequency more quickly and maintain the supply voltage closer to a lower voltage limit to reduce power consumption and allow safer operations.

For example, a method for adaptively controlling a frequency of an output clock signal, which controls the timing of an integrated circuit, is described. The method receives an input clock signal and determines, based on an output of one or more sensors operatively coupled to the integrated circuit, a reduction amount by which to reduce the frequency of the output clock signal. The method selectively gates, for a group of multiple clock cycles of the input clock signal, a portion of the input clock signal to generate a gated clock signal. The gated clock signal has fewer clock cycles than the group of multiple clock cycles over a same duration of time. The method then delays transitions of the clock cycles of the gated clock signal to generate the output clock signal. The delayed transitions cause the period of the individual clock cycles to be longer, which allows transistors in the integrated circuit to have more time to transition to the correct state based on clock timings.

This document also describes other methods, configurations, and systems, for adaptive frequency control in integrated circuits. Optional features of one aspect, such as the method described above, may be combined with other aspects.

This Summary is provided to introduce simplified concepts for adaptive frequency control in integrated circuits, which is further described below in the Detailed Description and Drawings. This Summary is not intended to identify essential features of the claimed subject matter, nor is it intended for use in determining the scope of the claimed subject matter.

BRIEF DESCRIPTION OF THE DRAWINGS

The details of one or more aspects of adaptive frequency control in integrated circuits are described in this document with reference to the following drawings. The same numbers are used throughout multiple drawings to reference like features and components.

DETAILED DESCRIPTION

Overview

This document describes adaptive frequency control in integrated circuits. Integrated circuits use clock signals to coordinate the sequence of operations. In other words, the clock signals can indicate to an integrated circuit when and how to execute programmed functions.

As described above, the frequency of the clock signal and the supply voltage define operation points of the integrated circuit. The clock frequency is proportional to the processing speed of the integrated circuit. Because the system voltage is inversely proportional to the time it takes transistors to change states, the voltage must be sufficiently high to allow the integrated circuit to operate at a particular frequency. Using the system voltage that satisfies the timing requirements for a particular frequency under all operating conditions can waste power. The fact that power usage scales with the square of the system voltage compounds the wasted power. For example, dropping the voltage by 5% can save about 10% of power consumption (e.g., 95%× 95%=90.25%). As a result, an important aspect of engineering and managing operations of an integrated circuit is minimizing the system voltage needed for the frequency of the clock signal.

Some integrated circuits employ adaptive voltage scaling, which attempts to use the least amount of voltage for a given clock frequency, to reduce power consumption. As a result, the integrated circuits monitor operating conditions to change the voltage. The time it takes to correct the voltage in response to changing operating conditions, however, affects how much the voltage can be adjusted. In other words, a lower response time generally allows the integrated circuit to maintain the system voltage closer to the lower operating limit, which provides more significant power saving potential. Under ideal operating conditions, a change in the voltage can generally take hundreds of microseconds.

The slow response to adjust the supply voltage directly impacts the power consumption and performance of an integrated circuit. For example, integrated circuits generally maintain a significant voltage margin to ensure that the highest possible voltage drop still satisfies the timing requirements of the integrated circuit. If the voltage drifts sufficiently low and results in a timing violation, the integrated circuit can brownout and stop functioning. An integrated circuit that can ensure voltage drops do not violate the timing requirements can run significantly closer to the lower voltage limit, with safer operations and reduced power consumption.

Other integrated circuits dynamically scale the voltage and frequency of the clock signal together as performance requirements change, power savings demand, or thermal issues arise. For example, the integrated circuit can adjust the voltage and clock frequency based on several factors, including temperature (e.g., higher temperatures cause higher current leakage and, thus, higher voltage requirements), current use, process node binning (e.g., decreasing or increasing the voltage requirements based on fabrication quality), and the number of resources in use (e.g., the number of cores online). Changes to the clock frequency are usually relatively slow. For example, a clock generator (e.g., a voltage-controlled oscillator and a phase-locked loop) can generally take hundreds of microseconds to adjust the frequency of the clock signal. The slow response time means that the system voltage cannot be maintained very close to its lower limit. During the adjustment period, the periods of clock cycles in the clock signal can experience a large amount of jitter. The jitter can cause the integrated circuit to operate slower than desired.

In contrast, the described systems and techniques more-quickly address marginal operating conditions of the integrated circuit. The marginal operating conditions can include operating conditions that are close to a limit at which the timing requirements of an integrated circuit are violated or at which brownout may occur. Instead of decreasing the voltage when operating states require or permit it, the described systems and techniques can dynamically adjust the frequency of the clock signal through a clock divider or a clock gater and a phase stretcher. The clock divider gates a fraction of the clock cycles of an input clock signal and the phase stretcher adjusts the period of the clock cycles in the gated clock signal. In this way, the integrated circuit can change the frequency of an output clock signal quickly (e.g., on the order of nanoseconds) instead of the slow response (e.g., hundreds of microseconds) of a clock generator or a phase-locked loop to adjust the frequency of the input clock signal.

This example is just one illustration of how the described adaptive frequency control can improve performance and power consumption for integrated circuits. Other example configurations and methods are described throughout this document. This document now describes example methods and components of the described adaptive frequency control.

Example Devices

Figure 1:
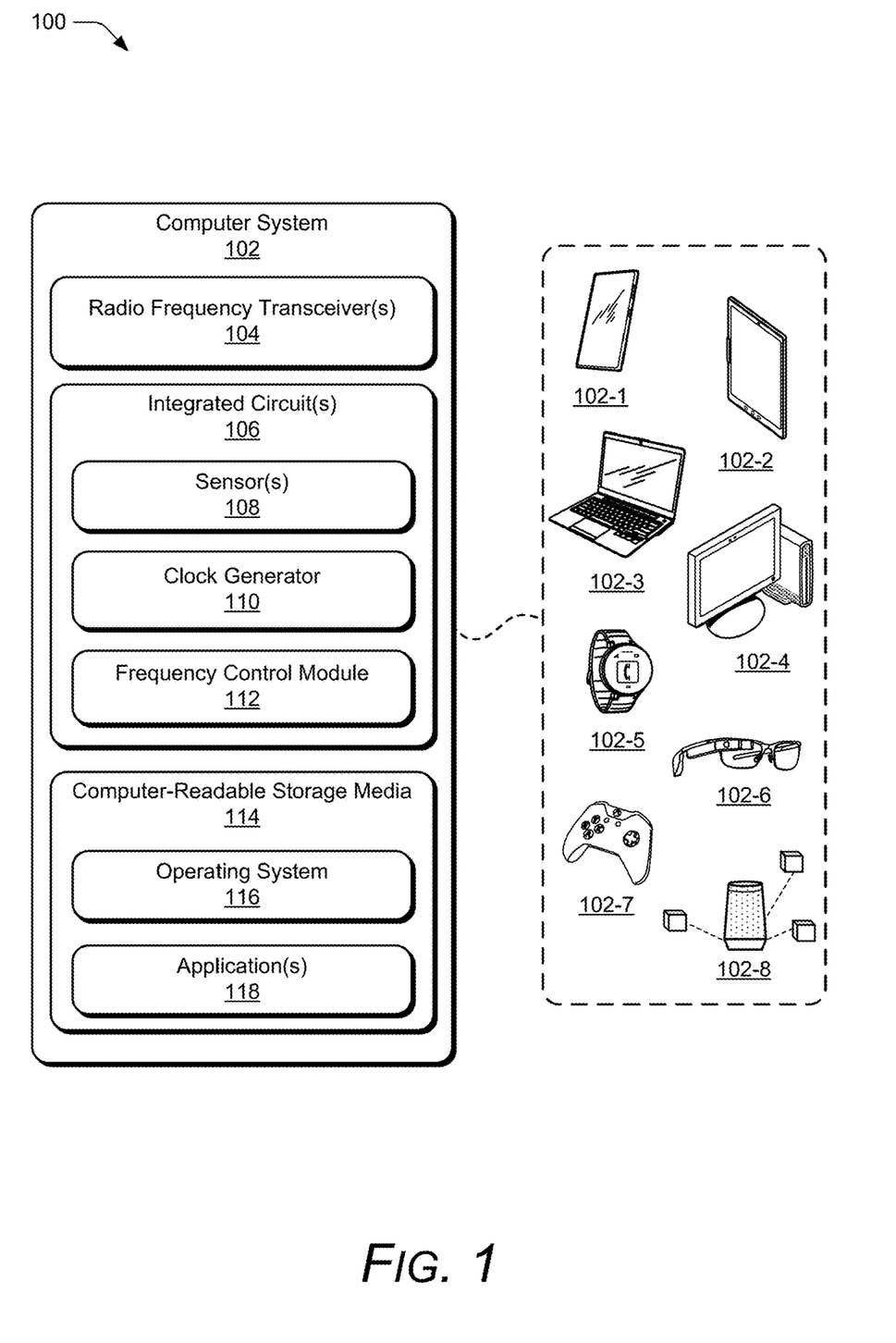
FIG. 1 illustrates an example device diagram of a computer system in which adaptive frequency control in integrated circuits can be implemented.

FIG. 1 illustrates an example device diagram 100 of a computer system 102 in which adaptive frequency control in one or more integrated circuits 106 can be implemented. The computer system 102 may include additional components and interfaces omitted from FIG. 1 for the sake of clarity.

The computer system 102 can be a variety of consumer electronic devices. As non-limiting examples, the computer system 102 can be a mobile phone 102-1, a tablet device 102-2, a laptop computer 102-3, a desktop computer 102-4, a computerized watch 102-5, a wearable computer 102-6, a video game controller 102-7, a voice-assistant system 102-8, and the like.

The computer system 102 includes one or more radio frequency (RF) transceiver(s) 104 for communicating over wireless networks. The computer system 102 can tune the RF transceiver(s) and supporting circuitry (e.g., antennas, front-end modules, amplifiers) to one or more frequency bands defined by various communication standards.

The computer system 102 includes the one or more integrated circuits 106. The integrated circuits 106 can include, as non-limiting examples, a central processing unit, a graphics processing unit, or a tensor processing unit. A central processing unit generally executes commands and processes needed for the computer system 102 and an operating system 116. A graphics processing unit performs operations to display graphics of the computer system 102 and can perform other specific computational tasks. The tensor processing unit generally performs symbolic match operations in neural-network machine-learning applications. The integrated circuits 106 can be single-core or multiple-core processors.

The computer system 102 also includes computer-readable storage media (CRM) 114. The CRM 114 is a suitable storage device (e.g., random-access memory (RAM), static RAM (SRAM), dynamic RAM (DRAM), non-volatile RAM (NVRAM), read-only memory (ROM), Flash memory) to store device data of the computer system 102. The device data can include the operating system 116, one or more applications 118 of the computer system 102, user data, and multimedia data. The operating system 116 generally manages hardware and software resources (e.g., the applications 118) of the computer system 102 and provides common services for the applications 118. The operating system 116 and the applications 118 are generally executable by the integrated circuits 106 (e.g., a central processing unit) to enable communications and user interaction with the computer system 102.

The integrated circuits 106 include one or more sensors 108, a clock generator 110, and a frequency control module 112. The integrated circuits 106 can include other components (not illustrated), including communication units (e.g., modems), input/output controllers, and system interfaces.

The one or more sensors 108 include sensors or other circuitry operably coupled to the integrated circuit 106. The sensors 108 monitor the process, voltage, and temperature of the integrated circuit 106 to assist in evaluating operating conditions of the integrated circuit 106. The sensors 108 can also monitor other aspects and states of the integrated circuit 106. The integrated circuit 106 can utilize outputs of the sensors 108 to monitor its chip state and provide an input to the frequency control module 112 to dynamically control the frequency of a clock signal. Other modules can also use the sensor outputs to adjust the system voltage of the integrated circuit 106.

The clock generator 110 provides an input clock signal, which can oscillate between a high state and a low state, to synchronize operations of the integrated circuit 106. In other words, the input clock signal can pace sequential processes of the integrated circuit 106. The clock generator 110 can include a variety of devices, including a crystal oscillator or a voltage-controlled oscillator, to produce the input clock signal with a consistent number of pulses (e.g., clock cycles) with a particular duty cycle (e.g., the width of individual high states) at the desired frequency. As an example, the input clock signal can be a periodic square wave.

The frequency control module 112 can alter the input clock signal generated by the clock generator 110. The frequency control module 112 can be implemented using hardware, software, firmware, or any combination thereof. The frequency control module 112 can adaptively manage, based on operating conditions of the integrated circuit 106 detected by one or more of the sensors 108, the frequency of the clock signal to improve performance and reduce the power consumption of the integrated circuit 106. This document describes the components and operation of the frequency control module 112 in greater detail with respect to FIG. 2.

Figure 2:
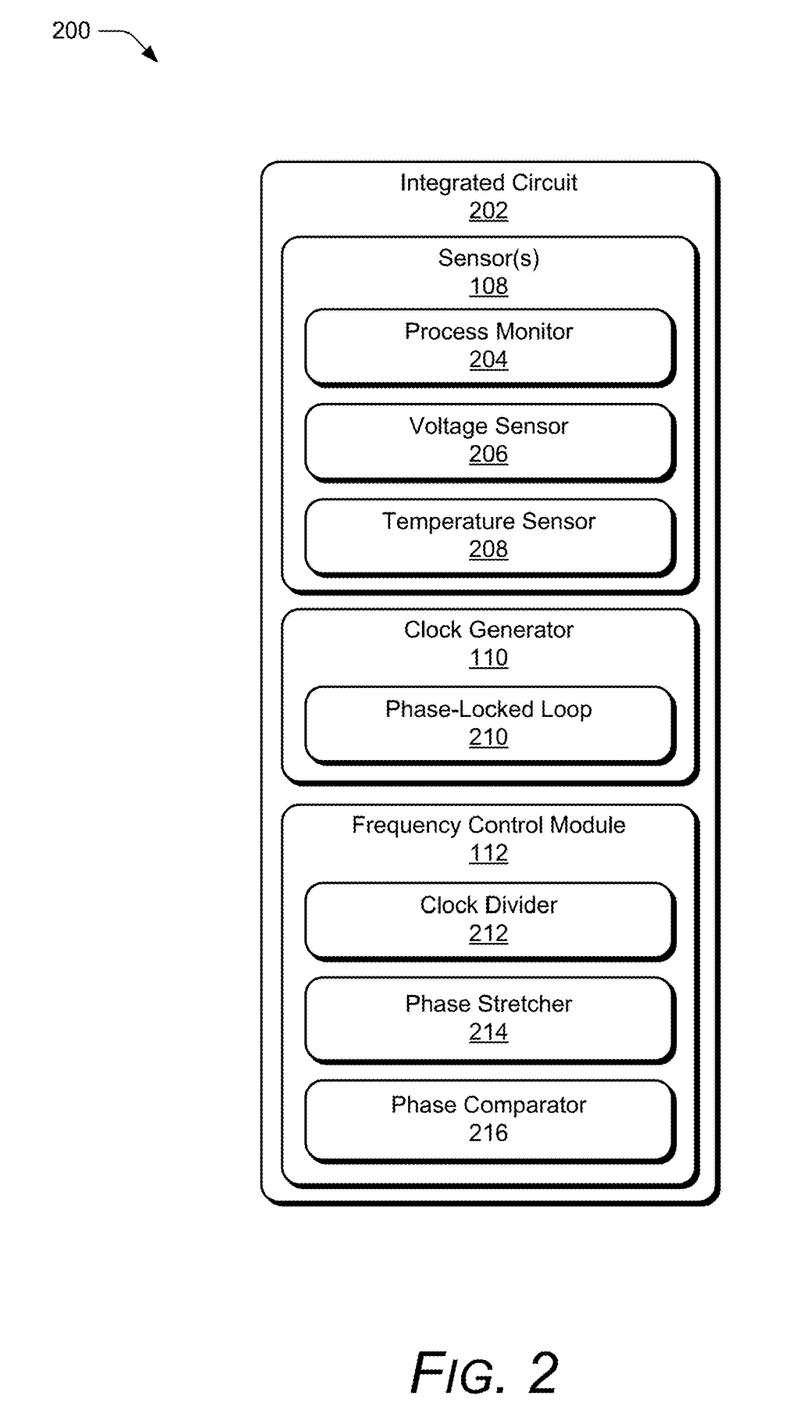
FIG. 2 illustrates an example device diagram of an integrated circuit in which adaptive frequency control can be implemented.

FIG. 2 illustrates an example device diagram 200 of an integrated circuit 202 in which adaptive frequency control can be implemented. In this example, the integrated circuit 202 includes similar components to those illustrated in the integrated circuit 106 of FIG. 1, with some additional detail. The integrated circuit 202 includes the sensors 108, the clock generator 110, and the frequency control module 112. The integrated circuit 202 can include additional components, which are not illustrated in FIG. 2.

The sensors 108 can include one or more process monitors 204, one or more voltage sensors 206, and one or more temperature sensors 208. As an example, the process monitors 204 can monitor process variabilities of the integrated circuit 202 to maintain the desired speed, power consumption, and performance. Process variabilities in the integrated circuit 202 can include resistance increases, increases in interconnection track lengths, sensitivities to voltage and temperature variations, and degradations due to aging of the integrated circuit 202. The voltage sensors 206 can monitor the supply voltage, including detecting any variability (e.g., voltage drops and drifts) due to electrical noise, supply perturbations, transient events, and glitches. The temperature sensors 208 can manage and monitor the temperature of the integrated circuit 202. Because temperature issues can arise from leakage, localized heating, and electromigration, design engineers can place the temperature sensors 208 at various locations on the integrated circuit 202 to monitor the local temperature at potentially problematic areas.

The clock generator 110, which can include a phase-locked loop 210, provides an input clock signal to synchronize operations of the integrated circuit 202. The integrated circuit 202 can use the phase-locked loop 210 to generate an input clock signal with a stable frequency. The phase-locked loop 210 can control an oscillator (e.g., a voltage-controlled oscillator) to lock the input clock signal in proportion to a reference signal from a stable reference (e.g., a crystal, a crystal oscillator, silicon micro-electromechanical system (MEMS) oscillator).

The frequency control module 112 can adjust the input clock signal generated by the clock generator 110 and/or the phase-locked loop 210 based on an output of at least one of the process monitor 204, the voltage sensor 206, or the temperature sensor 208. The frequency control module 112 can include a clock divider 212, a phase stretcher 214, and a phase comparator 216.

The clock divider 212 can gate a subset of clock cycles of the input clock signal to generate a gated clock signal. For example, the clock divider 212 can remove every nth cycle of the input clock signal to reduce the number of clock cycles for a group of multiple clock cycles. The phase stretcher 214 can offset clock cycles of a gated clock signal to generate an output clock signal. For example, the phase stretcher 214 can delay transitions of the clock cycles in the gated clock signal to adjust the period or duty cycle of the clock cycles. The phase comparator 216 can monitor for a difference in a phase of the output clock signal in comparison to a phase of the input clock signal. This document describes the operation of the frequency control module 112, including the clock divider 212, the phase stretcher 214, and the phase comparator 216, in greater detail with respect to FIGS. 3A and 3B.

Figure 3A:
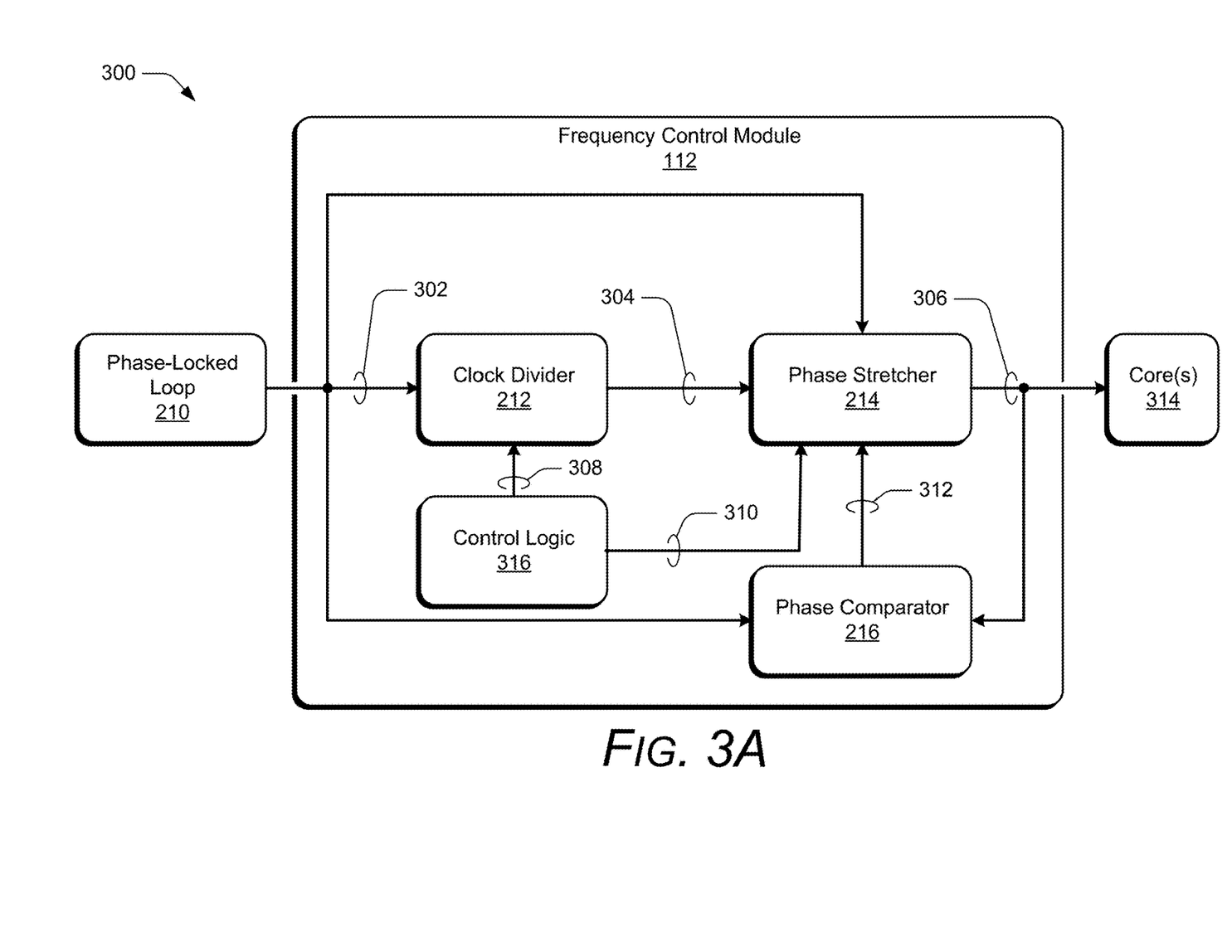
FIG. 3A illustrates an example diagram for a configuration of a frequency control module for adaptive control of the frequency of an integrated circuit.

FIG. 3A illustrates an example configuration 300 of the frequency control module 112 for adaptive control of the frequency of the integrated circuit 202. The frequency control module 112 includes the clock divider 212, the phase stretcher 214, and the phase comparator 216 of FIG. 2. The phase-locked loop 210 outputs an input clock signal 302 to the clock divider 212. The frequency control module 112 provides an output clock signal 306, which can have a lower frequency than a frequency of the input clock signal 302, to one or more cores 314 of the integrated circuit 202. In some implementations where each core 314 has an individual (e.g., separate) output clock signal, an individual (e.g., separate) input clock signal 302 can be output to the frequency control module 112 for each one of the cores 314. In other implementations, a single input clock signal 302 can be provided to generate one or more output clock signals 306 for the multiple cores 314.

The one or more cores 314 can be individual processors within the integrated circuit 202. For example, the integrated circuit 202 can contain one, two, or four cores 314. In some implementations, each of the cores 314 can work on a single task or single type of task to improve the efficiency of the integrated circuit 202.

The clock divider 212 is also connected to a control logic 316 and the phase stretcher 214. In this example, the control logic 316 is part of the frequency control module 112. In other implementations, the control logic 316 can be part of the clock generator 110 or located elsewhere on the integrated circuit 202. The control logic 316 can provide, based on an input from at least one of the process monitor 204, the voltage sensor 206, or the temperature sensor 208, a gating control signal 308 to the clock divider 212. The gating control signal 308 can indicate an amount by which to reduce the frequency of the output clock signal 306. As an example, instead of, or in addition to, adjusting the system voltage of the integrated circuit 202, the control logic 316 can dynamically adjust the frequency of the output clock signal 306 in response to marginal operating conditions detected by at least one of the process monitor 204, the voltage sensor 206, or the temperature sensor 208.

In implementations that the integrated circuit 202 includes multiple cores 314, the integrated circuit 202 can include one or more sensors 108 associated with each of the cores 314. The control logic 316 can analyze the output of the one or more sensors 108 to determine the reduction amount by which to reduce the frequency of the output clock signal 306. The control logic 316 can determine the reduction amount from a lookup table based on the sensor output(s) and the system voltage. For example, if the system voltage drops below a particular value, the control logic 316 can request a reduction of the frequency of the output clock signal 306.

In other implementations, the control logic 316 can monitor an average frequency of the output clock signal 306 as a function of the output of the sensors 108. The control logic 316 can use the average frequency information to determine the frequency of the output clock signal 306 in response to future operating conditions of the integrated circuit 202. The control logic 316 can also use the average frequency information to operate the integrated circuit 202 at more aggressive operating points (e.g., clock frequency and system voltage pairs) for similar conditions in the future.

The clock divider 212, based on the gating control signal 308, can gate a subset of cycles of the input clock signal 302 to generate a gated clock signal 304. For example, the gating control signal 308 can cause the clock divider 212 to remove every mth cycle of the input clock signal 302. As a result, the gated clock signal 304 has n cycles, where n is equal to (m−1), and the ratio of n to m (e.g., n/m) is approximately equal to the reduction amount.

The phase stretcher 214 can adjust a period of the clock cycles of the gated clock signal 304 to reduce the frequency of the output clock signal 306. For example, the phase stretcher 214 can delay transitions of the clock cycles in the gated clock signal 304 by a unit offset to adjust the duty cycle (e.g., width) of the high states. In some implementations, the phase stretcher 214 connects to the control logic 316, which outputs a stretching control signal 310. The stretching control signal 310 can indicate the unit offset to be applied to each of then clock cycles of the gated clock signal 304.

The phase stretcher 214 can also connect to the phase comparator 216. The phase comparator 216 can compare a phase of the output clock signal 306 to a phase of the input clock signal 302. The phase comparator 216 can also determine whether a period of the clock cycles (e.g., the time for a high state and a low state associated with a clock cycle) in the output clock signal 306 is less than a period of the clock cycles in the input clock signal 302. Based on these determinations, the phase comparator 216 can provide a feedback signal 312 to the phase stretcher 214 if an error in the phase offset is detected. The phase stretcher 214, based on the feedback signal 312, can adjust the unit offsets applied to the gated clock signal 304 by, for example, reducing the offset for each clock cycle. In this manner, the phase stretcher 214 can adjust the unit offsets applied to the gated clock signal 304 to prevent the period of the clock cycles in the output clock signal being less than the period of the clock cycles in the input clock signal. More particularly, if an offset is applied cumulatively, such that each clock cycle in the gated clock signal 304 in a group of clock cycles is offset by more than the previous clock cycle, it is possible that when the end of the group of clock cycles is reached an offset which is greater than a single input clock period will have been applied. In some circumstances, this could result in the final clock period of the output clock signal 306 being less than a period of the input clock signal 302. By decreasing the offset for each clock cycle in response to such an error being detected, it is possible to increase the period of the final clock cycle in the group of clock cycles, and avoid such an error.

In other implementations, the phase comparator 216 can provide the feedback signal 312 to the clock divider 212 and/or the control logic 316. The clock divider 212, based on the feedback signal 312, can skip additional cycles of the input clock signal 302 while the phase stretcher 214 applies the same offsets to the gated clock signal 304. The control logic 316, based on the feedback signal 312, can terminate the adaptive frequency control and/or adjust parameters included in the gating control signal 308 and/or the stretching control signal 310.

Figure 3B:
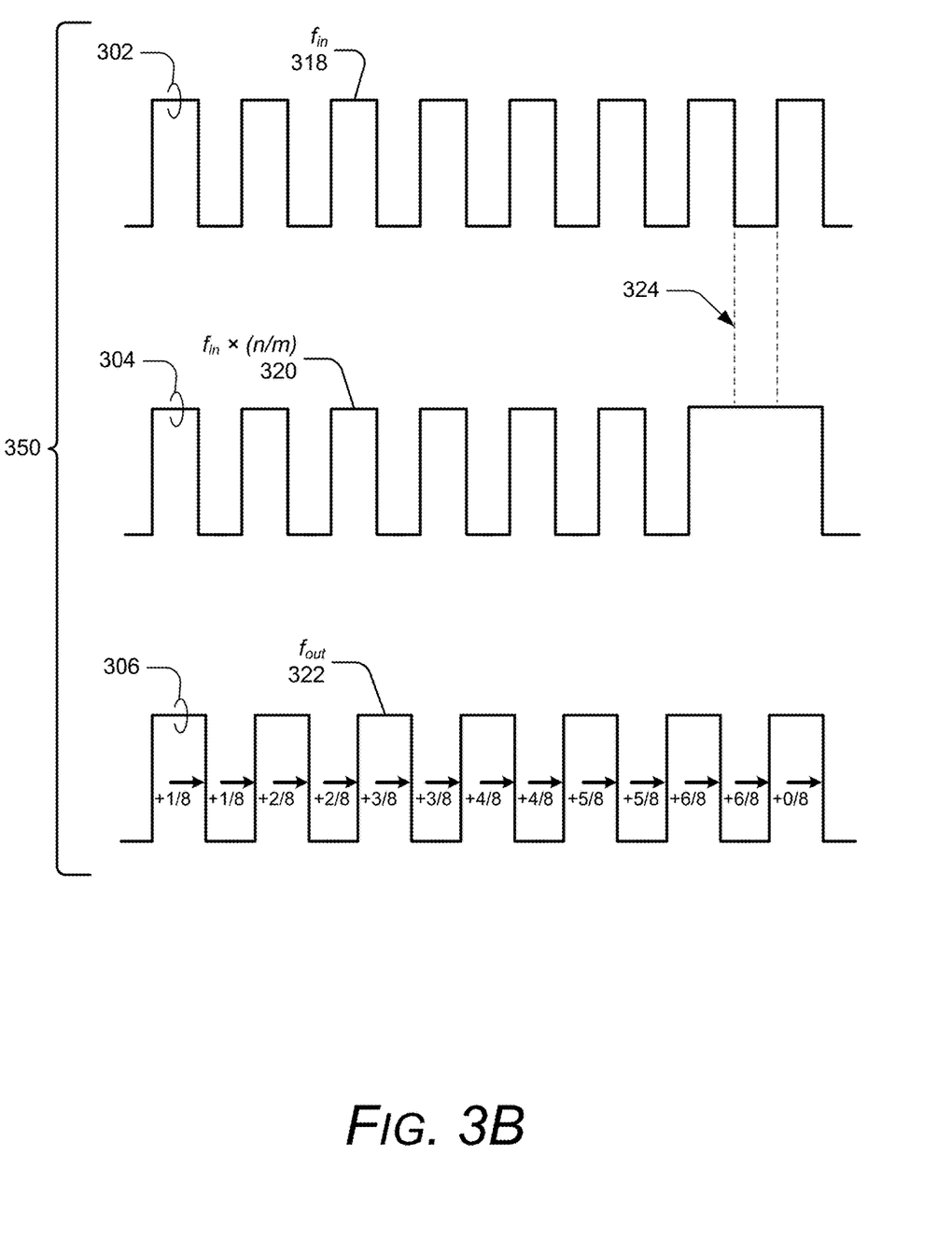
FIG. 3B illustrates example clock signals of a frequency control module.

FIG. 3B illustrates example clock signals 350 of the frequency control module 112. In particular, FIG. 3B illustrates examples of an input frequency 318 of the input clock signal 302, a gated frequency 320 of the gated clock signal 304, and an output frequency 322 of the output clock signal 306. In this example, the frequency control module 112 includes similar components to those illustrated in the frequency control module 112 of FIG. 3A.

In operation, the phase-locked loop 210 provides the input clock signal 302 as an input to the clock divider 212. The input frequency 318 provides eight cycles for a certain duration of time. The clock divider 212, based on the gating control signal 308, gates a subset of clock cycles of the input clock signal 302 to generate the gated clock signal 304. In other words, the clock divider 212 can pass every n of m clock cycles of the input clock signal 302 and gate the (n+1)th, (n+2)th, . . . , and mth clock cycle, or some other selection of (m−n) clock cycles. In this example, the gating control signal 308 controls the clock divider 212 to reduce the output frequency 322 of the output clock signal 306 by approximately 12.5%. In response, the clock divider 212 gates every eighth clock cycle of the input clock signal 302. FIG. 3B illustrates the gating of the eighth clock cycle, with the seventh clock cycle including the low state and high state of the previous eighth clock cycle. In other words, the clock divider 212 causes a falling edge and rising edge (collectively, a low state 324) to be skipped in the mth clock cycle.

The gated clock signal 304 includes seven clock cycles for the certain duration of time. Most clock cycles, specifically (n−1) clock cycles, in the gated clock signal 304 have the same phase and duty cycle as the clock cycles in the input clock signal 302. In other words, the phase and duty cycle of the first six clock cycles of the gated clock signal 304 are unaffected by the clock divider 212.

The phase stretcher 214 adjusts the period of the clock cycles in the gated clock signal 304. In this example, the phase stretcher 214 adds a unit offset of 1/n (e.g., 1/8) of a clock period to the period of the first (n−1) clock cycles (e.g., the first six clock cycles) of the gated clock signal 304. In this way, the period of the n clock cycles is m/n-times (e.g., nine-eighths times) larger than the period of the clock cycles in the input clock signal 302.

In some implementations, the phase stretcher 214 does not adjust the period of the clock cycles to be uniform to account for potential errors in the phase stretching. Instead, the phase stretcher 214 can apply an offset factor, a, to the unit offset to ensure that no clock cycle has a shorter period than the periods of the input clock signal 302. As a result, the phase stretcher 214 applies an offset of 1/(n+a) to the first (n−1) clock cycles (e.g., the first six clock cycles) of the gated clock signal 304. If the value of the offset factor is one, then the phase stretcher 214 applies an offset of one-eighth (e.g., 1/(7+1)=1/8) is added to the first six clock cycles of the gated clock signal 304. In this way, the first six clock cycles have a period nine-eighths of the period of the input clock signal 302, and the last clock cycle has a period ten-eighths of the period in the input clock signal 302.

The phase stretcher 214 can apply the offsets to the rising edges and falling edges of the gated clock signal 304. As illustrated in FIG. 3B, the phase stretcher 214 uses the following offsets (expressed in terms of the fraction of the period of the input clock signal 302) to the falling edges and rising edges: 1/8, 1/8, 2/8, 2/8, 3/8, 3/8, 4/8, 4/8, 5/8, 5/8, 6/8, 6/8, and 0/8. In this way, the duration of the high states is increased by one-eighth of a clock period for the first six clock cycles and by one-fourth of a clock period for the seventh clock cycle of the gated clock signal 304. The duration of the low states remains constant for each of the clock cycles. As a result, the period of each clock cycle in the output clock signal 306 is increased by at least one-eighth, which results in the frequency of the output clock signal 306 being approximately one-eighth lower than the frequency of the input clock signal 302. In the described example, the duty cycle of the output clock signal 306 is extended with respect to the duty cycle of the input clock signal 302.

Example Methods

Figure 4:
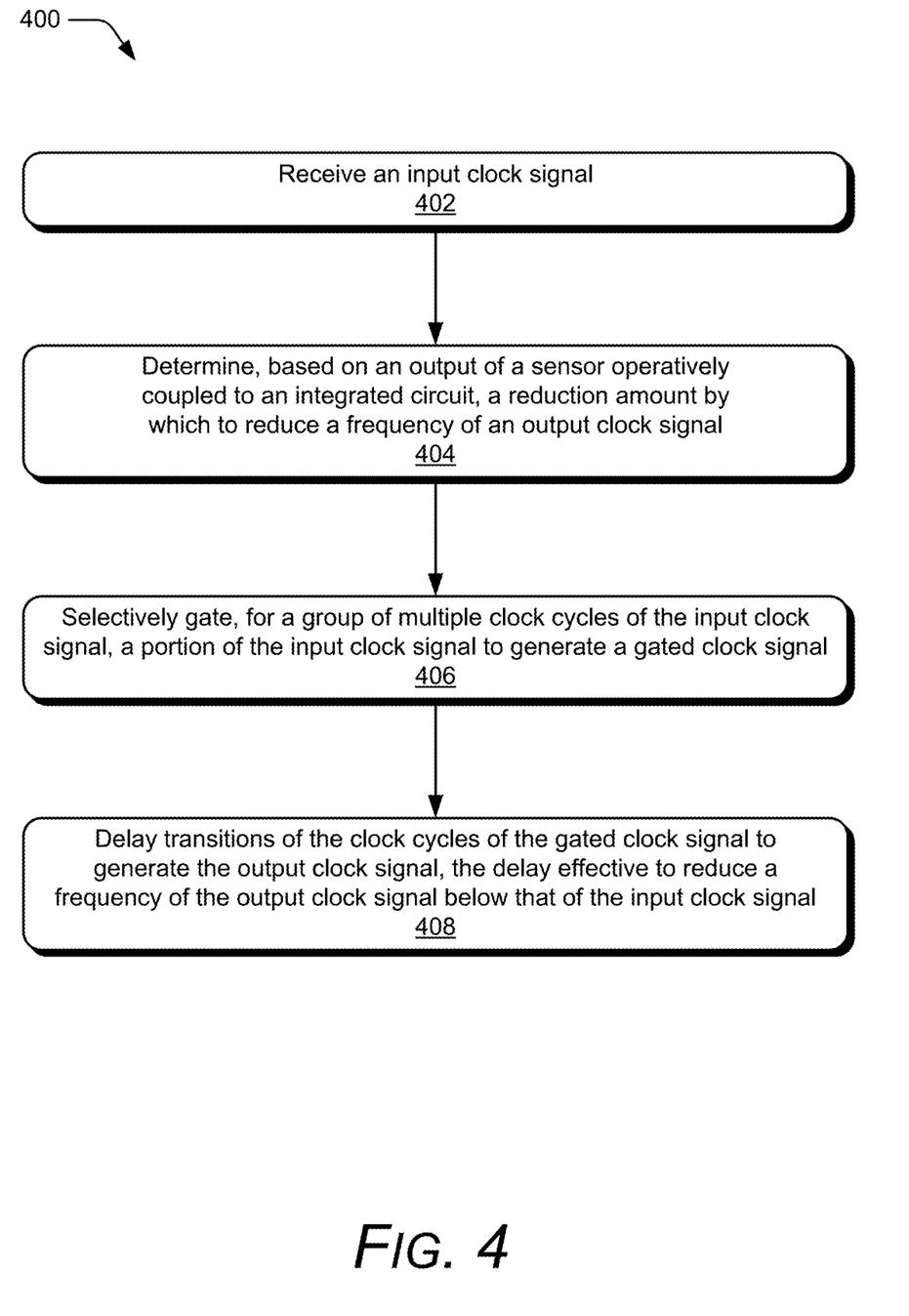
FIG. 4 is a flowchart illustrating an example method performed by a frequency control module for adaptive frequency control in an integrated circuit.

FIG. 4 is a flowchart illustrating an example method 400 performed by the frequency control module 112 for adaptive frequency control in the integrated circuit 202. The output clock signal 306 can control the timing of the integrated circuit 202. The method 400 is shown as a set of blocks that specify operations performed but are not necessarily limited to the order or combinations shown for performing the operations by the respective blocks. The method 400 is described in the context of the frequency control module 112 of FIG. 3A, reference to which is made for example only. The method 400 may be performed in a different order or with additional or fewer operations. Further, any of one or more of the steps of the method 400 may be repeated, combined, reorganized, or linked to provide a wide array of additional and/or alternate methods.

At 402, an input clock signal is received. For example, the frequency control module 112 receives the input clock signal 302. The input clock signal 302 can be output by the clock generator 110 and/or the phase-locked loop 210.

At 404, a reduction amount by which to reduce a frequency of the output clock signal is determined. The determination is based on an output of a sensor operatively coupled to the integrated circuit. For example, the control logic 316 determines, based on an output of the one or more sensors 108 operatively coupled to the integrated circuit 202, a reduction amount by which to reduce the output frequency 322 of the output clock signal 306. The one or more sensors 108 can include one or more of the process monitor 204, the voltage sensor 206, or the temperature sensor 208.

At 406, a portion of the input clock signal, for a group of multiple clock cycles of the input clock signal, is selectively gated to generate a gated clock signal. The gated clock signal has fewer clock cycles than the group of multiple clock cycles over a same duration of time. For example, the clock divider 212 selectively gates, for a group of multiple clock cycles of the input clock signal 302, a portion of the input clock signal 302 to generate the gated clock signal 304. The gated clock signal 304 has fewer clock cycles than the group of multiple clock cycles of the input clock signal 302 over a same duration of time. As illustrated in FIG. 3B, the clock divider 212 can gate the eighth cycle of the multiple clock cycles in the input clock signal 302 to generate a gated group of multiple clock cycles with seven cycles over the same duration of time.

At 408, transitions of the clock cycles of the gated clock signal are delayed to generate the output clock signal. The delay is effective to cause the frequency of the output clock signal to be lower than a frequency of the input clock signal by approximately the reduction amount. For example, the phase stretcher 214 delays transitions of the clock cycles of the group in the gated clock signal 304 to generate the output clock signal 306. The delay is effective to cause the output frequency 322 of the output clock signal 306 to be lower than the input frequency 318 of the input clock signal 302 by approximately the reduction amount.

Example Configurations

This section illustrates example configurations for adaptive frequency control in integrated circuits, which may occur separately or together in whole or in part. This section describes various example configurations, each described in relation to a drawing for ease of reading.

Figure 5:
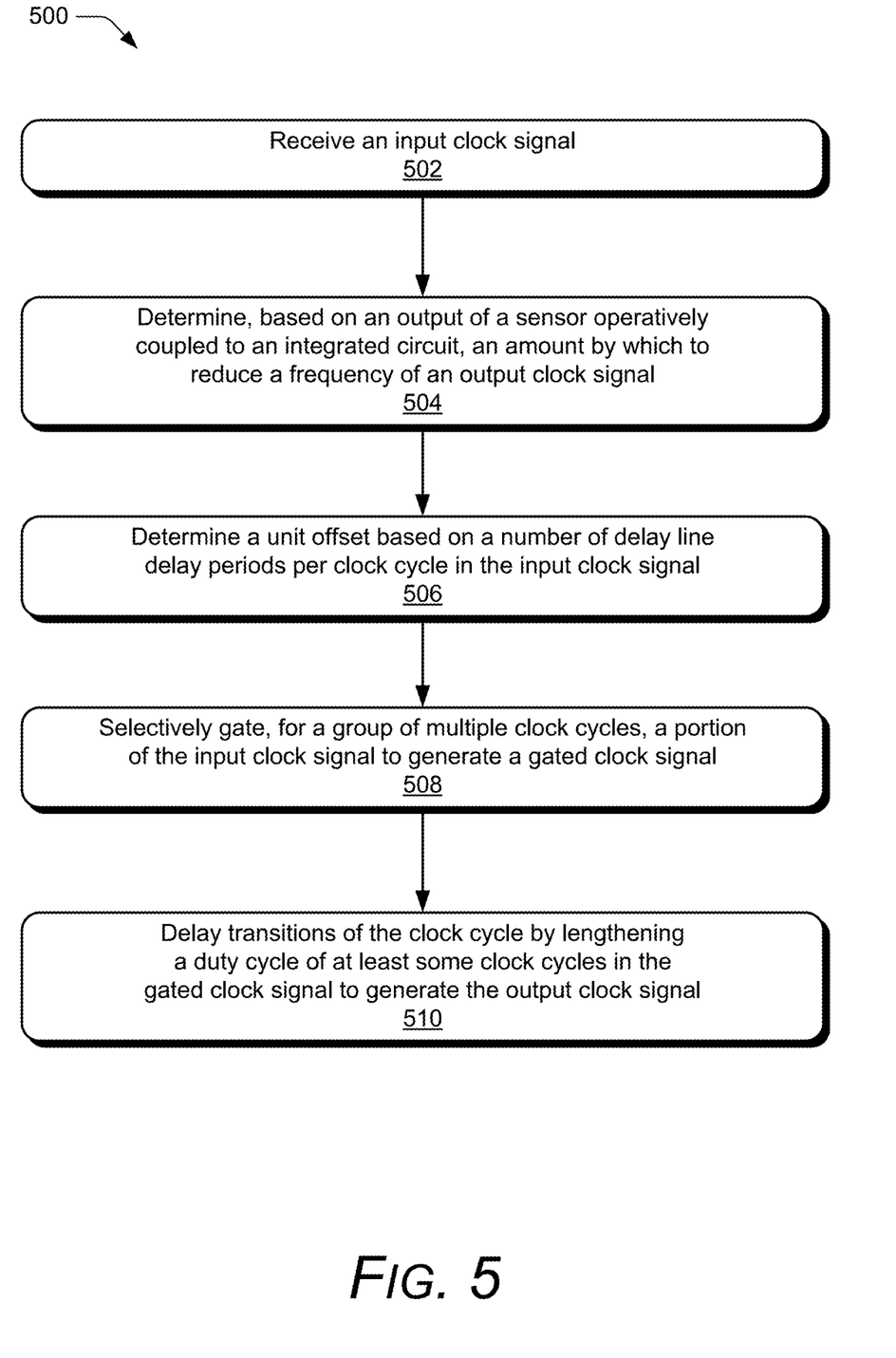
FIG. 5 illustrates an example method for adaptive frequency control in an integrated circuit utilizing delay lines.

FIG. 5 illustrates an example method 500 for adaptive frequency control in the integrated circuit 202 utilizing delay lines. In particular, the phase stretcher 214 uses delay lines to stretch the clock cycles of the gated clock signal 304. The method 500 is shown as a set of blocks that specify operations performed but are not necessarily limited to the order or combinations shown for performing the operations by the respective blocks. The method 500 is described in the context of the frequency control module 112 of FIG. 3A, reference to which is made for example only. The method 500 may be performed in a different order or with additional or fewer operations than illustrated. Further, any of one or more of the steps of the method 500 may be repeated, combined, reorganized, or linked to provide a wide array of additional and/or alternate methods.

At 502, an input clock signal is received. For example, the frequency control module 112 receives the input clock signal 302. The input clock signal 302 can be output by the clock generator 110 and/or the phase-locked loop 210.

At 504, a reduction amount by which to reduce a frequency of the output clock signal is determined. The determination is based on an output of a sensor operatively coupled to the integrated circuit. For example, the control logic 316 determines, based on an output of one or more of the sensors 108 operatively coupled to the integrated circuit 202, a reduction amount by which to reduce the frequency of the output clock signal 306. The one or more sensors 108 can include one or more of the process monitor 204, the voltage sensor 206, or the temperature sensor 208.

At 506, a unit offset based on a number of delay line delay periods per clock cycle in the input clock signal are determined. For example, the phase stretcher 214 can determine the unit offset based on the number of delay line delay periods per clock cycle in the input clock signal 302.

At 508, a portion of the input clock signal, for a group of multiple clock cycles of the input clock signal, is selectively gated to generate a gated clock signal. The gated clock signal has fewer clock cycles than the group of multiple clock cycles over a same duration of time. For example, the clock divider 212 selectively gates, for a group of multiple clock cycles of the input clock signal 302, a portion of the input clock signal 302 to generate the gated clock signal 304. The gated clock signal 304 has fewer clock cycles than the group of multiple clock cycles of the input clock signal 302 over a same duration of time.

At 510, transitions of the clock cycles of the gated clock signal are delayed by lengthening a duty cycle of at least some clock cycles in the gated clock signal to generate the output clock signal. The lengthening of the duty cycle comprises delaying a rising edge and/or a falling edge of the clock cycle by passing the clock signal through a particular number of delay lines, each of which delays the signal by a predetermined delay period. The delay is effective to cause the frequency of the output clock signal to be lower than a frequency of the input clock signal by approximately the reduction amount. For example, the phase stretcher 214 delays transitions of the clock cycles in the gated clock signal 304 by lengthening a duty cycle of each clock cycle to generate the output clock signal 306. The phase stretcher 214 lengthens the duty cycle of each clock cycle by delaying a rising edge and/or a falling edge of each of the clock cycles by a particular number of delay line delay periods. The delay is effective to cause the frequency of the output clock signal 306 to be lower than the frequency of the input clock signal 302 by approximately the reduction amount. Because each delay line delays the signal by a delay period, a delay duration can be referred to in terms of a number of delay lines through which the signal is passed. For example, when referring to a delay of "four delay lines", it can be meant a delay having a duration of four times the delay period of a single delay line, which can be implemented by passing a signal through four delay lines.

Consider the example illustrated in FIG. 3B. The phase stretcher 214 applies the following offsets to the falling edges and rising edges in the gated clock signal 304: 1/8, 1/8, 2/8, 2/8, 3/8, 3/8, 4/8, 4/8, 5/8, 5/8, 6/8, 6/8, and 0/8. In this example, the phase stretcher 214 determines that there are 32 delay line delay periods per clock cycle in the input clock signal 302. In other implementations, another component can determine the number of delay line delay periods per clock cycle in the input clock signal 302. Because there are 32 delay lines per clock cycle, the phase stretcher 214 applies the following delays in terms of delay line delay periods to the falling edges and rising edges of the gated clock signal 304: four delay lines (e.g., a single unit offset), four delay lines, eight delay lines (e.g., two unit offsets), eight delay lines, 12 delay lines, 12 delay lines, 16 delay lines, 16 delay lines, 20 delay lines, 20 delay lines, 24 delay lines, 24 delay lines, and zero delay lines. As a result, the period of each clock cycle in the output clock signal 306 is increased by at least one-eighth, which results in the frequency of the output clock signal 306 being approximately one-eighth of the frequency of the input clock signal 302.

In the described implementation, a single unit offset corresponds to four delay line delay periods, but a single unit offset can correspond to a different number of delay line delay periods in other implementations. Moreover, in the described implementation, the unit offset is applied first to the falling edges, and then, an equal offset is applied to the following rising edges, resulting in a extension to the duration of the "high" period of each clock cycle, while the duration of the "low" period of each clock remains constant. In another implementation, the same overall effect could be implemented by distributing the offset more equally between rising and falling edges. For example, the phase stretcher could apply the following offsets to the falling edges and rising edges in the gated clock signal: 1/16, 2/16, 3/16, 4/16, 5/16, 6/16, 7/16, 8/16, 9/16, 10/16, 11/16, 12/16, and 0/16. Such an implementation would result in the first delay (e.g.,  1/16) being provided by two delay lines, and so on. In such an implementation, a portion (e.g., half) of the unit offset would applied to the falling edge, and another portion (e.g., half) of the unit offset would be applied to the following rising edge, with each portion being equal, and being applied by a respective number (e.g., in this case, two) of delay lines. Different distributions and unit offset amounts can be provided.

In this way, the unit offset can be applied to one or both of the rising edges and falling edges. It will be understood that any offset applied will accumulate through the group of clock cycles, to provide a cumulative offset which gradually increases through the group of clock cycles, with a portion of the cumulative offset having been applied to either or both of rising edges and falling edges during each (or at least some) of the clock cycles within the group.

Figure 6:
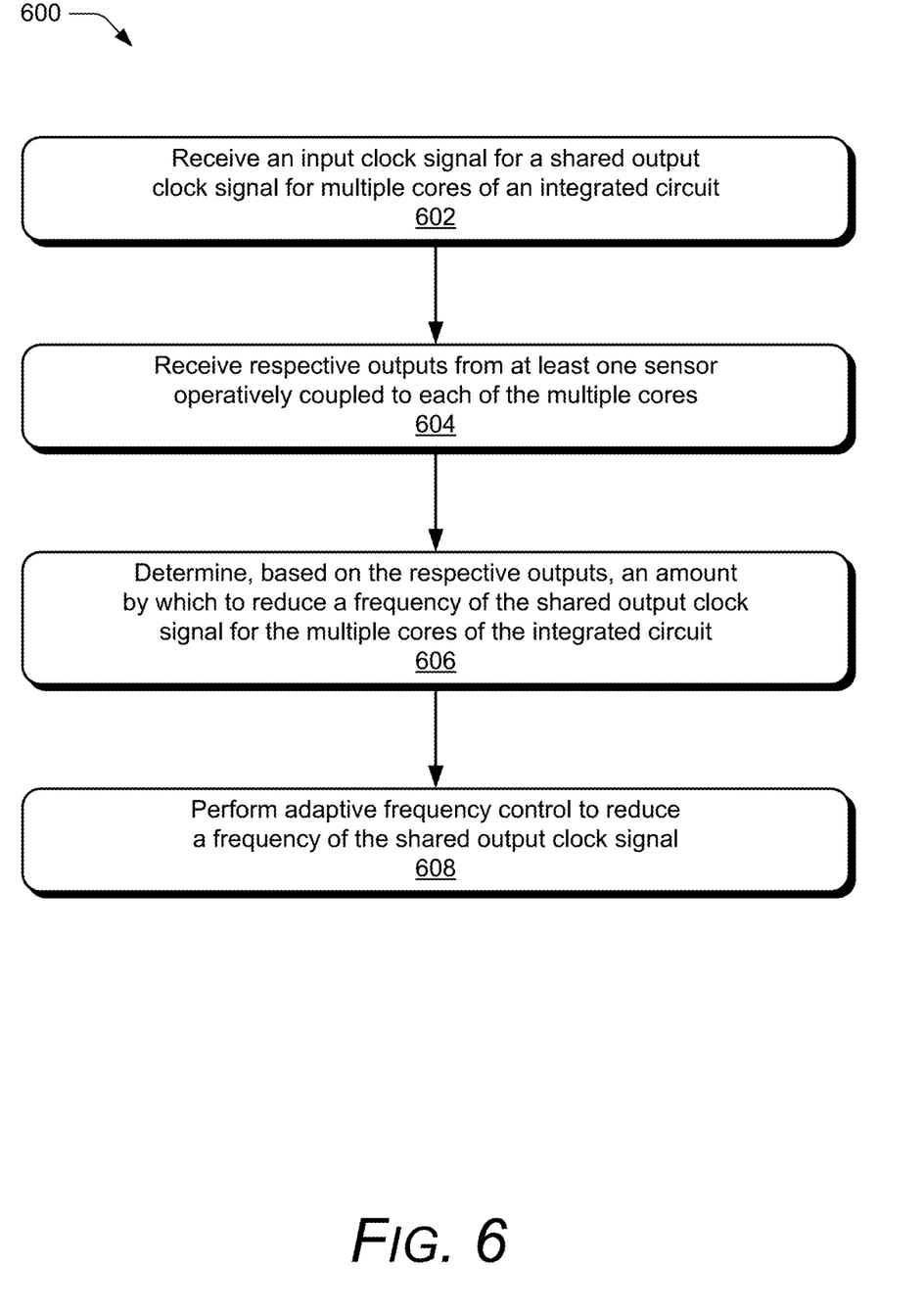
FIG. 6 illustrates an example method for adaptive frequency control in an integrated circuit with multiple cores.

FIG. 6 illustrates an example method 600 for adaptive frequency control in the integrated circuit 202 with multiple cores 314. The method 600 is shown as a set of blocks that specify operations performed but are not necessarily limited to the order or combinations shown for performing the operations by the respective blocks. The method 600 is described in the context of the frequency control module 112 of FIG. 3A, reference to which is made for example only. The method 600 may be performed in a different order or with additional or fewer operations. Further, any of one or more of the steps of the method 400 may be repeated, combined, reorganized, or linked to provide a wide array of additional and/or alternate methods.

At 602, an input clock signal for a shared output clock signal for multiple cores of an integrated circuit is received. For example, the frequency control module 112 receives the input clock signal 302. The input clock signal 302 can be output by the clock generator 110 and/or the phase-locked loop 210. The frequency control module 112, based on the input clock signal 302, provides a shared output clock signal 306 to two or more cores 314 of the integrated circuit 202.

At 604, an output from at least one sensor operatively coupled to each of the multiple cores of the integrated circuit is received. For example, each of the cores 314 can be operatively coupled to one or more sensors 108, including at least one of a process monitor 204, a voltage sensor 206, and a temperature sensor 208. That is, a respective sensor 108 or sensors 108 can be provided for each of the cores 314. The control logic 316 can receive an output from the one or more sensors 108 for at least two of the cores 314. In some implementations, the control logic 316 can include separate logic for each of the cores 314 or a combined logic for the cores 314.

At 606, a reduction amount by which to reduce a frequency of the shared output clock signal for the multiple cores of the integrated circuit is determined. The reduction amount is based on the respective outputs of the sensors, the minimum frequency required by the multiple cores. For example, the control logic 316 determines, based on the respective outputs of the one or more sensors 108 operatively coupled to at least two of the cores 314, a reduction amount by which to reduce the frequency of the shared output clock signal 306. The frequency control module 112 uses the highest minimum frequency required by either one of the cores 314 as the frequency of the shared output clock signal 306. The frequency of the shared output clock signal 306 is not reduced below the minimum frequency required by any one of the cores 314. As an example, the control logic 316 can determine the frequency required by one of the cores 314 from a lookup table based on the sensor output(s) for the respective core 314. The frequency control module 112 can use the smallest potential reduction amount to adjust the frequency of the shared output clock signal 306.

At 608, adaptive frequency control is performed to reduce a frequency of the shared output clock signal. For example, the frequency control module 112 performs adaptive frequency control as described in detail above to reduce a frequency of the shared output clock signal 306 for the cores 314.

Alternatively, where separate output clock signals 306 are provided to different cores 314, a respective reduction amount may be determined for each of the individual output clock signals 306 based on outputs of respective sensors 108 operatively coupled to each respective one of the cores 314. In such an arrangement, a plurality of frequency control modules 112 may be provided, or a frequency control module 112 configured to perform independent clock gating and phase stretching for the different output clock signals 306 may be provided.

EXAMPLES

In the following section, examples are provided.

Example 1: A method for adaptively controlling a frequency (322) of an output clock signal (306), the output clock signal (306) controlling timing of an integrated circuit (202), the method comprising: receiving an input clock signal (302); determining, based on an output of a sensor (108) operably coupled to the integrated circuit (202), a reduction amount by which to reduce the frequency (322) of the output clock signal (306); selectively gating, for a group of multiple clock cycles of the input clock signal (302), a portion of the input clock signal to generate a gated clock signal (304), the gated clock signal (304) having fewer clock cycles than the group of multiple clock cycles over a same duration of time; and delaying transitions of the clock cycles of the gated clock signal (304) to generate the output clock signal (306), the delay effective to cause the frequency (322) of the output clock signal (306) to be lower than a frequency (318) of the input clock signal (302) by approximately the reduction amount.

Example 2: The method of example 1, the method further comprising: monitoring for a difference in a phase of the output clock signal and a phase of the input clock signal to ensure that respective periods of the output clock signal are not less than a period of the input clock signal.

Example 3: The method of example 2, the method further comprising: in response to detecting a difference in the phase of the output clock signal and the phase of the input clock signal, generating a feedback signal based on the difference in the phase of the output clock signal and the phase of the input clock signal; and adjusting the delayed transitions of the clock cycles in the gated clock signal to prevent the period of the clock cycles in the output clock signal being less than the period of the clock cycles in the input clock signal.

Example 4: The method of any preceding example, the method further comprising: determining, by tracking an average frequency of the output clock signal, a future average frequency of the output clock signal; and determining, based on the future average frequency of the output clock signal, another reduction amount by which to reduce the frequency of the output clock signal.

Example 5: The method of any preceding example, wherein the sensor comprises: at least one of a process monitor, a voltage sensor, or a temperature sensor of the integrated circuit.

Example 6: The method of example 5, the method further comprising: determining respective potential reduction amounts by which to reduce the frequency of the output clock signal based on at least two of the process monitor, the voltage sensor, and the temperature sensor, wherein the reduction amount by which to reduce the frequency of the output clock signal comprises the smallest potential reduction amount.

Example 7: The method of any preceding example, wherein selectively gating the portion of the input clock signal comprises: gating a last clock cycle for the group of multiple clock cycles in the input clock signal.

Example 8: The method of any preceding example, wherein delaying the transitions of at least some of the clock cycles in the gated clock signal comprises: lengthening a clock period of at least one clock cycle in the group of multiple clock cycles by a unit offset.

Example 9: The method of example 8, wherein the unit offset includes an offset factor, the offset factor is effective to avoid a period of the clock cycles in the output clock signal being less than a period of the clock cycles in the input clock signal.

Example 10: The method of example 8, wherein the unit offset is effective to create an approximately uniform period for the clock cycles of the output clock signal.

Example 11: The method of at least one of the examples 8 to 10, wherein delaying the transitions of the clock cycles in the gated clock signal comprises: determining the unit offset based on a number of delay line delay periods per clock cycle in the input clock signal, wherein lengthening the period of at least one clock cycle in the group of multiple clock cycles by the unit offset comprises at least one of: applying a portion of the unit offset to a rising edge of the at least one clock cycle by a first respective number of delay lines; or applying a portion of the unit offset to a falling edge of the at least one clock cycle by a second respective number of delay lines.

Example 12: The method of any preceding example, wherein the reduction amount is determined by looking up at least one of a supply voltage of the integrated circuit or the output of the sensor in a lookup table.

Example 13: The method of any preceding example, wherein: the integrated circuit includes at least two cores, the at least two cores share the output clock signal; and the reduction amount is determined based on a highest minimum frequency required by either of the at least two cores.

Example 14: The method of at least one of the examples 1 to 12, wherein: the integrated circuit includes at least two cores, the at least two cores each have individual output clock signals; and a respective reduction amount for each of the individual output clock signals is determined based on an output of a respective sensor operatively coupled to the respective one of the at least two cores.

Example 15: An adaptive frequency control circuit implemented in hardware configured to perform a method of at least one of the examples 1 to 14.

CONCLUSION

While various configurations and methods for adaptive frequency control in integrated circuits have been described in language specific to features and/or methods, it is to be understood that the subject of the appended claims is not necessarily limited to the specific features or methods described. Rather, the specific features and methods are disclosed as non-limiting examples of adaptive frequency control in integrated circuits.

What is claimed is:

1. A method for adaptively controlling a frequency of an output clock signal, the output clock signal controlling timing of an integrated circuit, the method comprising:
receiving an input clock signal comprising a first set of multiple clock cycles;
determining, based on an output of a sensor operably coupled to the integrated circuit, a reduction amount by which to reduce the frequency of the output clock signal;
selectively gating, for the first set of multiple clock cycles of the input clock signal, one clock cycle of the first set of multiple clock cycles of the input clock signal to generate a gated clock signal comprising a second set of multiple clock cycles, the second set of multiple clock cycles of the gated clock signal having one fewer clock cycle than the first set of multiple clock cycles of the input clock signal over a same duration of time;
delaying rising transitions and falling transitions of the second set of multiple clock cycles of the gated clock signal to generate the output clock signal comprising a third set of multiple clock cycles, the delaying causing the frequency of the output clock signal to be lower than a frequency of the input clock signal by the reduction amount, the delaying of the rising transitions and the falling transitions of the second set of multiple clock cycles comprising:
applying a first delay offset to a rising transition and a falling transition of a first clock cycle of the second set of multiple clock cycles; and
applying a second delay offset to a rising transition and a falling transition of a second clock cycle of the second set of multiple clock cycles, the second delay offset being different from the first delay offset;
monitoring for a difference in a phase of the output clock signal and a phase of the input clock signal to ensure that respective periods of the output clock signal are not less than a period of the input clock signal;
in response to detecting a difference in the phase of the output clock signal and the phase of the input clock signal, generating a feedback signal based on the difference in the phase of the output clock signal and the phase of the input clock signal; and
adjusting the delaying of the rising transitions and the falling transitions of each of the second set of multiple clock cycles to prevent the period of the third set of multiple clock cycles in the output clock signal from being less than the period of the first set of multiple clock cycles in the input clock signal.

2. The method of claim 1, further comprising:
determining, by tracking an average frequency of the output clock signal, a future average frequency of the output clock signal; and
determining, based on the future average frequency of the output clock signal, another reduction amount by which to reduce the frequency of the output clock signal.

3. The method of claim 1, wherein the sensor comprises:
at least one of a process monitor, a voltage sensor, or a temperature sensor of the integrated circuit.

4. The method of claim 3, further comprising:
determining respective potential reduction amounts by which to reduce the frequency of the output clock signal based on at least two of the process monitor, the voltage sensor, and the temperature sensor; and
using one of the respective potential reduction amounts as the reduction amount by which to reduce the frequency of the output clock signal.

5. The method of claim 1, wherein selectively gating the one clock cycle of the first set of multiple clock cycles of the input clock signal comprises:
gating a last clock cycle of the first set of multiple clock cycles in the input clock signal.

6. The method of claim 1, wherein delaying the rising transitions and the falling transitions of second set of multiple clock cycles of the gated clock signal comprises:
lengthening a clock period of at least one clock cycle of the second set of multiple clock cycles by a unit offset, wherein the first delay offset or the second delay offset is a multiple of the unit offset.

7. The method of claim 6, wherein the unit offset includes an offset factor, the offset factor is configured to avoid a period of a clock cycle of the third set of multiple clock cycles of the output clock signal being less than a period of a clock cycle of the first set of multiple clock cycles of the input clock signal.

8. The method of claim 6, wherein the unit offset is configured to create a uniform period for the third set of multiple clock cycles of the output clock signal.

9. The method of claim 1, wherein the reduction amount is determined by looking up at least one of a supply voltage of the integrated circuit or the output of the sensor in a lookup table.

10. The method of claim 1, wherein:
the integrated circuit includes at least two cores, the at least two cores share the output clock signal; and
the reduction amount is determined based on a highest minimum frequency required by either of the at least two cores.

11. The method of claim 1, wherein:
the integrated circuit includes at least two cores, the at least two cores each have individual output clock signals; and
a respective reduction amount for each of the individual output clock signals is determined based on an output of a respective sensor operatively coupled to a respective one of the at least two cores.

12. The method of claim 1, wherein the second delay offset applied to the rising transition and the falling transition of the second clock cycle of the second set of multiple clock cycles is a multiple of the first delay offset applied to the rising transition and the falling transition of the first clock cycle of the second set of multiple clock cycles.

13. An apparatus comprising:
an integrated circuit;
a clock generator configured to provide a clock signal; and
a frequency control module comprising:
a first input coupled to an output of the clock generator;
a second input coupled to a sensor associated with the integrated circuit; and
an output coupled to a clock input of the integrated circuit, the frequency control module configured to:
receive, via the first input, the clock signal provided by the clock generator as an input clock signal comprising a first set of multiple clock cycles;
receive, via the second input, an output signal of the sensor;
determine, based on the output signal of the sensor, a reduction amount by which to reduce a frequency of an output clock signal provided at the output of the frequency control module;
selectively gating, for the first set of multiple clock cycles of the input clock signal, one clock cycle of the first set of multiple clock cycles of the input clock signal to generate a gated clock signal comprising as second set of multiple clock cycles, the second set of multiple clock cycles of the gated clock signal having one fewer clock cycle than the first set of multiple clock cycles of the input clock signal over a same duration of time;

delaying rising transitions and falling transitions of the second set of multiple clock cycles of the gated clock signal to generate the output clock signal comprising a third set of multiple clock cycles, the delaying causing the frequency of the output clock signal to be lower than a frequency of the input clock signal by the reduction amount, the delaying of the rising transitions and the falling transitions of the second set of multiple clock cycles comprising:

applying a first delay offset to a rising transition and a falling transition of a first clock cycle of the second set of multiple clock cycles; and applying a second delay offset to a rising transition and a falling transition of a second clock cycle of the second set of multiple clock cycles, the second delay offset being different from the first delay offset;

monitor for a difference in a phase of the output clock signal and a phase of the input clock signal to ensure that respective periods of the output clock signal are not less than a period of the input clock signal;

in response to detecting the difference in the phase of the output clock signal and the phase of the input clock signal, generate a feedback signal based on the difference in the phase of the output clock signal and the phase of the input clock signal; and adjust, based on the feedback signal, the delaying of the rising transitions and the falling transitions of each of the second set of multiple clock cycles to prevent the period of the third set of multiple clock cycles in the output clock signal from being less than the period of the first set of multiple clock cycles in the input clock signal.

14. The apparatus of claim 13, wherein the frequency control module is further configured to:

determine, by tracking an average frequency of the output clock signal, a future average frequency of the output clock signal; and determine, based on the future average frequency of the output clock signal, another reduction amount by which to reduce the frequency of the output clock signal.

15. The apparatus of claim 13, wherein the sensor comprises at least one of a process monitor, a voltage sensor, or a temperature sensor of the integrated circuit.

16. The apparatus of claim 15, wherein selectively gating the one clock cycle of the first set of multiple clock cycles of the input clock signal comprises:

gating a last clock cycle of the first set of multiple clock cycles of the input clock signal.

17. The apparatus of claim 13, wherein delaying the rising transitions and the falling transitions of second set of multiple clock cycles of the gated clock signal comprises:

lengthening a clock period of at least one clock cycle of the second set of multiple clock cycles by a unit offset, wherein the first delay offset or the second delay offset is a multiple of the unit offset.

18. The apparatus of claim 17, wherein the unit offset includes an offset factor, the offset factor is configured to avoid a period of a clock cycle of the third set of multiple clock cycles of the output clock signal being less than a period of a clock cycle of the first set of multiple clock cycles of the input clock signal.

19. The apparatus of claim 17, wherein the unit offset is configured to create a uniform period for the third set of multiple clock cycles of the output clock signal.

20. The apparatus of claim 13, wherein the frequency control module is further configured to determine the reduction amount by looking up at least one of a supply voltage of the integrated circuit or the output of the sensor in a lookup table.

* * * * *